US006352814B1

(12) United States Patent
McCullough et al.

(10) Patent No.: US 6,352,814 B1
(45) Date of Patent: Mar. 5, 2002

(54) METHOD OF FORMING A DESIRED PATTERN

(75) Inventors: Christopher David McCullough, Leeds West Yorkshire; Kevin Barry Ray, Morley, both of (GB)

(73) Assignee: Kodak Polychrome Graphics LLC, Norwalk, CT (US)

( * ) Notice: Subject to any disclaimer, the term of this patent is extended or adjusted under 35 U.S.C. 154(b) by 0 days.

(21) Appl. No.: 09/267,861

(22) Filed: Mar. 12, 1999

(51) Int. Cl.[7] .................................................. G03F 7/30

(52) U.S. Cl. .................... 430/302; 430/175; 430/270.1; 430/271.1; 430/326; 430/945

(58) Field of Search ............................. 430/175, 270.1, 430/271.1, 326, 302, 945

(56) References Cited

U.S. PATENT DOCUMENTS

| | | | | | |
|---|---|---|---|---|---|
| 3,628,953 | A | | 12/1971 | Brinkman | 430/270 |
| 4,247,611 | A | | 1/1981 | Sander et al. | 430/286 |
| 4,708,925 | A | | 11/1987 | Newman | 430/270 |
| 4,973,572 | A | | 11/1990 | DeBoer | 503/227 |
| 5,372,915 | A | * | 12/1994 | Haley et al. | 430/302 |
| 5,466,557 | A | | 11/1995 | Haley et al. | 430/278 |
| 5,491,046 | A | | 2/1996 | DeBoer et al. | 430/302 |
| 5,658,708 | A | | 8/1997 | Kondo | 430/288.1 |
| 5,705,308 | A | | 1/1998 | West et al. | 430/165 |
| 5,763,134 | A | * | 6/1998 | Busman et al. | 430/157 |
| 6,042,987 | A | * | 3/2000 | Kobayashi | 430/270.1 |
| 6,074,802 | A | * | 6/2000 | Murata et al. | 430/270.1 |

FOREIGN PATENT DOCUMENTS

| | | | |
|---|---|---|---|
| EP | 625 728 | A2 | 11/1994 |
| EP | 652 483 | A1 | 5/1995 |
| EP | 819 980 | A1 | 1/1998 |
| EP | 0823327 | | 2/1998 |
| EP | 867 278 | A1 | 9/1998 |
| GB | 1155035 | | 6/1969 |
| JP | 0943847 | | 2/1997 |
| WO | 9620429 | | 7/1996 |
| WO | 9739894 | | 10/1997 |

* cited by examiner

*Primary Examiner*—John S. Chu
(74) *Attorney, Agent, or Firm*—Ratner & Prestia

(57) ABSTRACT

A method for producing a predetermined resist pattern on e.g. a lithographic printing plate, circuit board or mask, comprises the patternwise exposure to heat of a composition which comprises a novolac resin, a latent Bronsted acid and optionally a pigment. The composition is rendered preferentially soluble to a developer, in the regions which were heated.

25 Claims, No Drawings

METHOD OF FORMING A DESIRED PATTERN

CLAIM TO PRIORITY

This application claims the benefit of UK application GB9805361.4 filed Mar. 13, 1998.

FIELD OF THE INVENTION

The present invention relates to methods of forming a desired pattern on a support which has coated on it a coating comprising a positive working heat sensitive composition. The methods are suitable for making lithographic printing forms or fine resist patterns of electronic parts such as printed circuits, or masks carrying resist patterns. The invention further relates to novel compositions, novel imaged articles and novel precursors therefor.

BACKGROUND OF THE INVENTION

The art of lithographic printing is based on the immiscibility of ink, generally an oily formulation, and water, wherein in the traditional method the ink is preferentially retained by the image or pattern area and the water or fountain solution is preferentially retained by the non-image or non-pattern area. When a suitably prepared surface is moistened with water and an ink is then applied, the background or non-image area retains the water whilst the image area accepts ink and repels the water. The ink on the image area is then transferred to the surface of a material upon which the image is to be reproduced, such as paper, cloth and the like. Commonly the ink is transferred to an intermediate material called the blanket which in turn transfers the ink to the surface of the material upon which the image is to be reproduced.

New types of "waterless" lithographic printing employ only an oily ink material and preferentially ink-accepting image areas and ink-repelling non-image areas on the printing form.

A generally used type of lithographic printing form precursor (by which we mean a coated printing form prior to exposure and development) has a light sensitive coating applied to an aluminium base support. Negative working lithographic printing form precursors have a radiation sensitive coating which when imagewise exposed to radiation of a suitable wavelength hardens in the exposed areas. On development the non-exposed areas of the coated composition are removed leaving the image. On the other hand positive working lithographic printing form precursors have a radiation sensitive coating, which after imagewise exposure to radiation of a suitable wavelength becomes more soluble in the exposed areas than in the non-exposed areas, in a developer. In both cases only the image area on the printing form itself is ink-receptive.

The differentiation between image and non-image areas is made in the exposure process where a film is applied to the printing form precursor with a vacuum to ensure good contact. The printing form precursor is then exposed to a light source, comprising UV radiation. In the case where a positive form precursor is used, the area of the film that corresponds to the image in the printing form precursor is opaque so that no light will strike the printing form precursor, whereas the area on the film that corresponds to the non-image area is clear and permits the transmission of light to the coating which becomes more soluble and is removed.

The resists used in pattern forming methods for electronic parts such as printed circuits are also classified into two types: negative working and positive working. After exposure to radiation and development, the resist pattern is used as a mask for forming the patterns onto the underlying electronic elements—for example by etching an underlying copper foil. Due to the high resolution demands and the requirements of high resistance to etching techniques, positive working systems are widely used. In particular, in the main there have been used alkali developable positive working photoresists mainly composed of alkali-soluble novolak resins as disclosed in J. C. Streiter, Kodak Microelectronics Seminar Proceedings, 1979, p. 116. The primary active component of such positive working compositions, both in the context of lithographic printing forms and electronic parts, is a naphthoquinonediazide (NQD) derivative.

The types of electronic parts whose manufacture may use a photo resist include printed wiring boards (PWBs), thick- and thin-film circuits, comprising passive elements such as resistors, capacitors and inductors; multichip devices (MDCs); and integrated circuits (ICs). These are all classified as printed circuits.

A mask may be used in imaging methods, the required resist pattern being formed on the mask, which is then used as a screen in a later processing step.

Neuman, U.S. Pat. No. 4,708,925 (3M) describes a radiation sensitive element e.g. a printing plate, having coated on it a composition stated to be photosolubilisable, comprising an alkali-soluble phenolic resin and an onium salt. The onium salt imparts developer resistance to the phenolic resin, this developer resistance being removed upon exposure to radiation, and consequent photolytic decomposition of the onium salt. Suitable onium salts are said to include iodonium, sulphonium, bromonium, chloronium, oxysulphonium, sulphoxonium, selenonium, telluronium, phosphonium and arsonium salt. Of these, iodonium, sulphonium and oxysulphonium are said to be preferred, especially iodonium. The maximum sensitivity of the composition is generally in the ultraviolet region but it is stated that the sensitivity can be adjusted by addition of one or more spectral sensitizers, of which many examples are listed, with oxonol dyes and cyanine dyes being preferred.

In EP-A-625728 (Kodak) there is described a radiation sensitive composition suitable for a printing plate, sensitive to both ultraviolet and infra-red radiation and capable of functioning in either a positive working or negative working manner, comprising (1) a resole resin, (2) a novolac resin, (3) a latent Bronsted acid and (4) an infra-red absorber. To utilize the printing plate as a positive-working plate requires that it be imagewise exposed to activating radiation, thereby rendering the exposed areas alkali-soluble. To utilize it as a negative working plate requires the steps of imagewise exposing to activating radiation, and heating the plate to provide reduced solubility in the unexposed regions. In achieving these properties the use of a mixture of a resole resin and a novolac resin is said to be essential.

Suitable latent Bronsted acids for use in the invention of EP-A-625728 are said to include onium salts, in particular iodonium, sulfonium, phosphonium, selenonium, diazonium and arsonium salts. Use of diazonium salts is said to be preferred due to their equivalent sensitivity to other latent Bronsted acids in the infra-red region and higher sensitivity in the ultraviolet region.

Suitable infra-red absorbers for use in the invention of EP-A-625728 are said to include dyes or pigments. It is preferred that the infra-red absorber fragments upon exposure to activating radiation.

The use of a wide range of acid donors in compositions for lithographic printing methods is also discussed in U.S. Pat. No. 4,247,611 (Hoechst).

SUMMARY OF THE INVENTION

We have now discovered an advantageous method, using a composition which contains a pigment.

In accordance with a first aspect of the present invention there is provided a method for producing a predetermined resist pattern on a support, the method comprising: the patternwise exposure of a precursor to heat, the precursor comprising the support with a coating thereon, the coating comprising a positive working composition; and the application of a developer to the patternwise-exposed coating; wherein said composition comprises a novolac resin as the sole or major resin component, and a Bronsted acid, wherein said composition has the property that it is preferentially developer soluble in the regions which have been exposed; and wherein said exposure is to a heat source placed in contact with the precursor, or to electromagnetic radiation, in the latter case the coating comprising a pigment which absorbs the electromagnetic radiation and converts it to heat.

Preferably said composition prior to being exposed is significantly less soluble in a selected developer, than the corresponding composition in the absence of said latent Bronsted acid; in practical terms the former may be regarded as an insoluble polymeric composition and the latter may be regarded as a soluble polymeric composition, in the selected developer.

The novolac resin is preferably the sole resin component. When it is not, it suitably comprises more than 50%, and preferably at least 65%, of the total resin content of the composition, by weight. Most suitably it comprises at least 85%, especially 90–100%, of the total resin content of the composition, by weight. An additional resin component, when present, may for example be a resole resin, a styrene, for example 4-hydroxystyrene, 3-methyl-4-hydroxystyrene and 4-methoxystyrene, an acrylic acid for example methacrylic acid and acrylic acid, maleimiide, maleic acid and maleic acid anhydride, in each case, as homopolymers, co-polymers or terpolymers.

The novolac resins useful in this invention are suitably condensation reaction products between appropriate phenols, for example phenol itself, C-alkyl substituted phenols (including cresols, xylenols, p-tert-butyl-phenol, p-phenylphenol and nonyl phenols), diphenols e.g. bisphenol-A (2,2-bis(4-hydroxyphenyl)propane), and appropriate aldehydes, for example formaldehyde, chloral, acetaldehyde and furfuraldehyde. The type of catalyst and the molar ratio of the reactants used in the preparation of phenolic resins determines their molecular structure and therefore the physical properties of the resin. An aldehyde:phenol ratio between 0.5:1 and 1:1, preferably 0.5:1 to 0.8:1 and an acid catalyst is used to prepare those phenolic resins generally known as novolacs which are thermoplastic in character. Higher aldehyde:phenol ratios of more then 1:1 to 3:1, and a basic catalyst would give rise to a class of phenolic resins known as resoles, and these are characterised by their ability to be thermally hardened at elevated temperatures.

A latent Bronsted acid is a compound which generates a Bronsted acid in situ on exposure, a Bronsted acid being a proton donor. Examples of suitable latent Bronsted acids include any of the acid-generating compounds described in U.S. Pat. No. 4,708,925, EP 625728 and U.S. Pat. No. 4,247,611, and the relevant passages therefrom relating to such compounds are incorporated herein.

Preferred latent Bronsted acids include onium salts and organic halogen compounds able to form hydrohalic acids. Especially preferred are onium compounds, for example iodonium, sulphonium, oxysulphonium, phosphonium, bromonium, chloronium, sulphoxonium, selenonium, telluronium, diazonium and arsonium salts. Diazonium salts are especially preferred. Certain latent Bronsted acids are sensitive to ambient UV light so safelight handling conditions are preferably employed for the method of the present invention.

Suitably the latent Bronsted acid is present in an amount of from 1 to 25% by weight, on the total weight of the composition when dried, preferably 1.5 to 15%, most preferably 2 to 8%.

Suitable pigments include carbon black or graphite, or a commercially available color pigment such as Heliogen Green as supplied by BASF, or Nigrosine Base NG1 as supplied by NH Laboratories Inc, or Milori Blue (C.I. Pigment Blue 27) as supplied by Aldrich.

The "pigments" required in the present invention are distinct from the "dyes" proposed for use, for example, in the methods of U.S. Pat. No. 4,708,925. Pigments are generally insoluble in the compositions and so comprise particles therein. Generally they are broad band absorbers, preferably able efficiently to absorb electromagnetic radiation and convert it to heat over a range of wavelengths exceeding 200 nm, preferably exceeding 400 nm. Generally they are not decomposed by the radiation. Generally they do not have any marked effect on the solubility of the unheated composition, in the developer. In contrast dyes are generally soluble in the compositions. Generally they are narrow band absorbers—typically able efficiently to absorb electromagnetic radiation and convert it to heat only over a range of wavelengths not exceeding 100 nm. Consequently they have to be carefully selected having regard to the wavelength of the radiation which is to be used for imaging. Generally they are decomposed by the radiation. Frequently they have a marked effect on the solubility of the unheated composition in the developer, typically making it much less soluble.

Suitably the pigment constitutes at least 1%, preferably at least 2%, preferably up to 20%, more preferably up to 15%, by weight on the total weight of the composition.

Thus a preferred weight range for the pigment may be expressed as 2–15% by weight on the total weight of the composition. There may be more than one pigment present in the composition. Whilst a pigment must be present, the additional presence of a dye is not excluded. References herein to the proportion of components are to their total content, when more than one component of a defined type is present in the composition.

The compositions of the invention may contain other ingredients such as stabilizing additives and inert colorants.

DETAILED DESCRIPTION OF THE INVENTION

We will now describe the formation of a desired pattern on a support, by means of a method as defined above. The support could, for example, be a coated lithographic printing form precursor, or a coated electronic part precursor, or a coated mask precursor.

In certain embodiments of the invention heat is patternwise delivered conductively to the precursor, by direct application. For example the composition may be contacted by a heat stylus; or the reverse face of the support onto which the composition has been coated may be contacted by a heat stylus.

In other embodiments of the invention electromagnetic radiation is used to expose the composition, the coating containing a radiation absorbing pigment which absorbs the radiation and converts it to heat. Preferably the wavelength of the radiation entirely or predominantly exceeds 500 nm. Preferably, it is entirely or predominantly in the range 600 to 1400 nm, more preferably 700 to 1200 nm. The electromagnetic radiation is preferably infra-red or visible radiation. Infra-red radiation is preferred, preferably delivered by a laser. However the use of a wide range of wavelengths is possible in the present invention due to the presence of a pigment, typically a broad band absorber.

Examples of lasers which can be used in the method of the present invention include semiconductor diode lasers emitting at between 600 nm and 1200 nm. An example is the Nd YAG laser which emits at 1064 nm, but any laser of sufficient imaging power and whose radiation is absorbed by the composition, can be used.

In one preferred embodiment of the invention an additional layer comprising a radiation absorbing pigment can be used. This multiple layer construction can provide routes to high sensitivity as larger quantities of absorber can be used without affecting the function of the image forming layer. Techniques for the formation and use of such films are well known in the art, for example as described in EP 0,652,483.

The preferred supports in the present invention in the context of lithography are those that are hydrophilic as the uniform coating or which can be treated to provide a hydrophilic surface, for example by use of a hydrophilic layer. However the invention is also applicable to waterless lithography, in which the support may be oleophilic and the coating oleophobic.

The support may be a semiconductor or conductor in the context of electronic circuitry. In the context of lithography it may be an aluminum plate which has undergone the usual anodic, graining and post-anodic treatments well known in the lithographic art for enabling a radiation sensitive composition to be coated thereon and for the surface of the support to function as a printing background. Another base material which may be used in the present invention in the context of lithography is a plastic material base or a treated paper base as used in the photographic industry. A particularly useful plastic material base is polyethylene terephthalate which has been subbed to render its surface hydrophilic. Also a so-called coated paper which has been corona discharge treated can be used.

In the specification when we state that a composition is developer soluble we mean that it is soluble in a developer, to an extent useful in a resist development process. When we state that a composition is developer insoluble we mean that it is not soluble in a developer, to an extent useful in a resist development process.

The composition is preferably used as a coating on a lithographic printing form, an electronic circuit form or a mask.

In the method of the present invention a positive working lithographic printing form, electronic part or mask is obtained after patternwise exposure and processing of a precursor. On patternwise exposure the exposed, heated, areas of the composition are rendered more soluble in the developer. The developer solubility of the coated composition is preferably such that there is no significant coating loss in the unexposed areas on development of the exposed areas. Therefore on imagewise exposure there is a change in the solubility differential of the unexposed composition and of the exposed composition. Thus in the exposed areas the composition is dissolved, to form the pattern.

The coated printing form, electronic circuit or mask precursors of the invention may be heat imaged indirectly by exposure to a short duration of high intensity radiation transmitted or reflected from the background areas of a graphic original located in contact with the recording material.

In another aspect of the invention the coated printing form, electronic circuit or mask precursors may be patternwise heated using a heated body, as described above.

In another aspect of the invention the coated printing form, electronic circuit or mask precursors may be exposed by means of suitable radiation, as defined above, to heat the coating patternwise.

The developer is dependent on the nature of the components of the composition, but is preferably an aqueous composition. Common components of aqueous developers are surfactants, chelating agents such as salts or ethylenediamine tetraacetic acid, organic solvents such as benzyl alcohol, and alkaline components such as inorganic metasilicates, organic metasilicates, hydroxides or bicarbonates.

Preferably the aqueous developer is an alkaline developer containing inorganic or organic metasilicates when the polymeric substance, as is preferred, is a phenolic resin.

In accordance with a further aspect of the present invention there is provided an imaged article, for example a printing form, electronic part or mask, having a pattern formed in the said coating thereof by means of the method of the present invention.

Certain compositions for use in the method of the present invention are believed to be novel and constitute a further aspect of the present invention. Such compositions are those described above, in which the novolac resin is the sole resin component or provides at least 85% by weight, preferably 90–100%, of the total resin content. Likewise, precursors carrying a coating comprising such novel composition are themselves novel and constitute further aspects of the present invention.

Simple tests, tests 1 to 5 below, may be carried out to determine if the composition comprising the composition, the selected developer and a hydrophilic support, are together likely to be suitable for the positive working method of the present invention, in the context of lithographic printing. For simplicity these tests involve the direct delivery of heat, whereas the delivery of heat to the composition in use may be direct or via conversion of incident radiation, as described above.

Test 1

The composition comprising the selected resin without any latent Bronsted acid or pigment being present is coated on a suitable hydrophilic support and dried. Then the surface is inked-up. If a uniform inked coating is obtained then the composition is ink-accepting when laid down as a coating.

Test 2

The support coated with the composition used for Test 1 is processed in the selected developer for a suitable time which may be determined by trial and error but will typically be between 15 to 120 seconds, at room temperature, and then rinsed, dried and inked-up. If no ink surface is obtained then the composition has dissolved in the developer.

Test 3

The composition comprising the resin, a latent Bronsted acid and a pigment is coated on the support, dried and inked-up. If a uniform inked coating is obtained then the composition is ink-accepting when laid down as a coating.

Test 4

The support coated with the composition used for Test 3 is processed in the selected developer for a suitable time which may be determined by trial and error but will typically be between 15 to 120 seconds, at room temperature, and then rinsed, dried and inked-up. If a uniform inked coating is obtained then the composition is insoluble in the developer.

Test 5

The support coated with the composition used for Test 3 is heated, for example in an oven or by use of a heated body placed in contact with it, such that the composition reaches a suitable temperature for an appropriate period of time. Then it is processed in the selected developer for an appropriate period of time at room temperature. The surface is then dried and inked-up. If no ink surface is obtained then the heated composition has dissolved in the developer. The temperature and time for the heating stage depend on the components selected for the composition and on their proportion. Simple trial and error experiments may be undertaken to determine suitable conditions. Initial failures may therefore not be determinative but if there is a persistent inability to obtain a pass result, despite reasonable efforts, the conclusion must be that the composition has failed this test. Preferably, a support may be heated such that the composition reaches a temperature of 50° C. to 180° C. for 5 to 20 seconds. Then it is processed in the selected developer for a suitable period of time which may be determined by trial and error but will typically be 15 to 120 seconds, at room temperature. Most preferably, the support is heated such that the composition reaches a temperature of 100° C. to 160° C. for 5 to 20 seconds. Then it is processed in the selected developer typically for 15 to 120 seconds at room temperature.

If the composition can pass these tests then it is suitable for use on a lithographic printing plate in the positive working method of the present invention provided of course that in embodiments involving the conversion of radiation to heat, the appropriate radiation therefor is delivered, having regard to any radiation absorbing compound which is present. Equally, a composition passing these tests is likely to fulfil the requirements for a resist for electronic circuits, or for masks. However, the aspects of the above tests which determine ink-accepting properties and the hydrophilic character of the support are irrelevant in this context and can be dispensed with.

Any feature of any aspect of the present invention or embodiment described herein may be combined with any feature of any other aspect of the invention or embodiment described herein.

The following Examples more particularly serve to illustrate the various aspects of the present invention described hereinabove.

EXAMPLES

The invention will now be described, by way of illustration, with reference to the examples which follow. Examples prefixed with the letter C are comparative examples not in accordance with the invention.

Starting Materials

The following materials are referred to hereinafter:

Resin A: LB 6564—a 1:1 phenol/cresol novolac resin marketed by Bakelite, UK.

Resin B: LB744—a cresol novolac resin marketed by Bakelite, UK.

Carbon black FW2—a channel type carbon black obtained from Degussa, Macclesfield, UK.

Prussian blue (ferric ferrocyanide, CI Pigment Blue 27) as supplied by Aldrich Chemical Company, Dorset, UK.

Onium Compound 1—Diphenyliodonium hexafluorophosphate as supplied by Avocado Research Chemicals Ltd., Heysham, UK.

Onium Compound 2—Cyracure UVI-6974, (triarylsulfonium hexafluoroantimonate) as supplied by Union Carbide Ltd., Rickmansworth, Herts, UK.

Onium Compound 3—Triphenylsulfonium hexafluorophosphate as supplied by Phase Sep UK, Deeside, Clwyd, UK.

Onium Compound 4—479-2092C, ((4-octyloxyphenyl) phenyl iodonium hexafluoroantimonate) as supplied by GE Silicones, New York, USA.

Onium Compound 5—Diazo LDN-1 $PF_6$ (Diphenylamine-4-diazonium hexafluorophosphate), as supplied by Varichem Co. Ltd. of Brynmawr, Wales.

Onium compound 6—Diazo LDN-2 $PF_6$ (diazo resin hexafluorophosphate), as supplied by Varichem Co. Ltd. of Brynmawr, Wales.

Dye W—KF654B PINA as supplied by Riedel de Haan UK, Middlesex, UK, believed to have the structure:

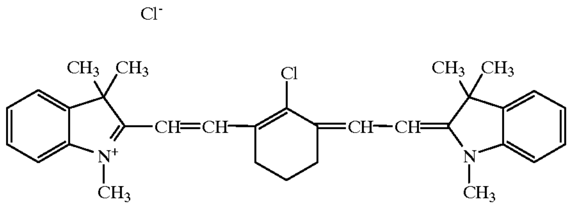

Dye X—NK2882, 2-[7-(1,3-Dihydro-5-methoxy-1,3,3-trimethyl-2H-indol-2-ylidene)-1,3,5-heptatrienyl]-5-methoxy-1,3,3-trimethyl-3H-indolium perchlorate as supplied by Ubichem Ltd. of Eastleigh, Hampshire, UK and having the structure:

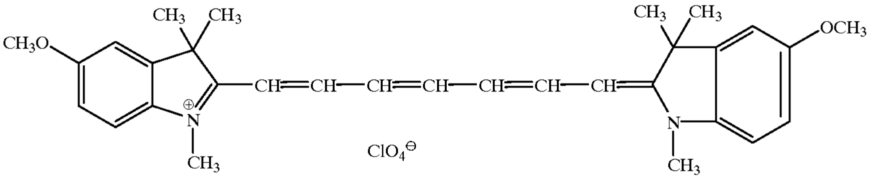

Dye Y having the structure:

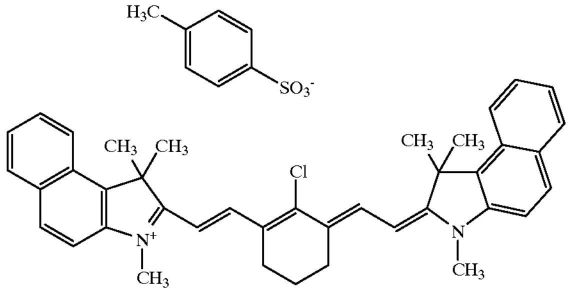

Dye Z—NK2268, 3-Ethyl-2-[2-[3-[2-(3-ethyl-2(3H)-benzothiazolylidene)ethylidene]-2-diphenylamino-1-cyclopenten-1-yl]ethenyl]benzothiazolium perchlorate as supplied by Ubichem Ltd. of Eastleigh, Hampshire, UK and having the structure:

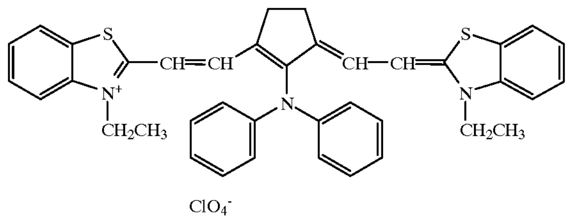

Developer A—14% sodium metasilicate pentahydrate in water.

Developer B—7% sodium metasilicate in water.

Developer C—3.5% sodium metasilicate in water.

Exposure Test Methods

Imaging Using Rotatable Disc Apparatus

For some examples the coated support to be imaged was cut into a circle of 105 mm diameter and placed on a disc that could be rotated at a constant speed of 2500 revolutions per minute. Adjacent to the spinning disc a translating table held the source of the laser beam so that the laser beam impinged perpendicularly to the coated support, while the translating table moved the laser beam radially in a linear fashion with respect to the spinning disc. The exposed image was in the form of a spiral whereby the image in the centre of the spiral represented slow laser scanning speed and long exposure time and the outer edge of the spiral represented fast scanning speed and short exposure time.

The laser used was a single mode 830 nm wavelength 200 mW laser which was focused to a spot of approximately 10 micron diameter. The laser power supply was a stabilized constant power source.

Imaging Using Creo Trendsetter 3244

A commercially available image setter, using Procomm Plus Software, operating at a wavelength of 830 nm at powers of up to 8 W and supplied by Creo Products Inc. of Burnaby, Canada was used for some examples, to yield more accurate sensitivity results.

Direct Heat Imaging

For some examples some of the plates were subjected to heat delivered from a Weller soldering iron EC 2100 M heated to 311° C. The speed of movement of the soldering iron over the plate surface was 1 $cms^{-1}$ in every case. The soldering face was applied to the coated face of the plates, for these examples.

Examples C1–C3 and 1–6

The coating formulations for examples 1–6 were ball milled together for 24 hours in 2-methoxypropan-2-ol/dimethylformamide 50:50 (v:v). The support used was a 0.3 mm sheet of aluminum that had been electrograined and anodized and post anodically treated with an aqueous solution of an inorganic phosphate. The coating solutions were coated onto the support by means of a wire wound bar. The solution concentrations were selected to provide the specified dry film compositions with a coating weight of 2.5 $gm^{-2}$ after thorough drying at 100° C. for 3 minutes in a Mathis labdryer oven as supplied by Werner Mathis AG, Germany.

| | Example | | | | | | | | |
|---|---|---|---|---|---|---|---|---|---|
| | C1 | 1 | 2 | C2 | 3 | 4 | C3 | 5 | 6 |
| Component | Parts by Weight | | | | | | | | |
| Resin A | 88 | 82 | 85 | | | | 88 | 82 | 85 |
| FW2 | 12 | 12 | 12 | 12 | 12 | 12 | | | |
| Onium Compound 1 | | 6 | 3 | | 6 | 3 | | 6 | 3 |
| Resin B | | | | 88 | 82 | 85 | | | |
| Prussian Blue | | | | | | | 12 | 12 | 12 |

The plates were then imaged on the rotatable disc apparatus as described above. The exposed plates were then processed by immersing in an aqueous developer solution at 20° C. for 60 seconds using an appropriate aqueous developer solution as described in the table below. Plate sensitivities were then determined.

| Example | Developer | Sensitivity | Remarks |
|---|---|---|---|
| C1 | B | — | All coating dissolves away |
| 1 | B | 64 $mJcm^{-2}$ | |
| 2 | C | 56 $mJcm^{-2}$ | Image attack seen as speckles |
| C2 | A | 110 $mJcm^{-2}$ | Image attack seen as speckles |
| 3 | A | 98 $mJcm^{-2}$ | |
| 4 | A | 88 $mJcm^{-2}$ | |
| C3 | A | — | All coating dissolves away |
| 5 | A | 85 $mJcm^{-2}$ | |
| 6 | A | 64 $mJcm^{-2}$ | |

Examples 7–12

The coating formulations for examples 7–12 were prepared as described in examples 1–6 as solutions in 2-methoxypropan-2-ol/dimethylformamide 50:50 (v:v). The formulations were coated as previously described to provide the specified dry film composition with a coating film weight of 2.5 $gm^{-2}$ after thorough drying at 130° C. for 3 minutes in a Mathis labdryer oven.

| | Example | | | | | | |
|---|---|---|---|---|---|---|---|
| | C2 | 7 | 8 | 9 | 10 | 11 | 12 |
| Component | Parts by Weight | | | | | | |
| Resin B | 88 | 82 | 85 | 82 | 85 | 82 | 85 |
| FW2 | 12 | 12 | 12 | 12 | 12 | 12 | 12 |
| Onium Compound 2 | | 6 | 3 | | | | |
| Onium Compound 3 | | | | 6 | 3 | | |
| Onium Compound 4 | | | | | | 6 | 3 |

The plates were then imaged on the rotatable disc apparatus as described above. The exposed plates were then processed by immersing in an aqueous developer solution at 20° C. for 60 seconds using an appropriate aqueous developer solution as described in the table below. Plate sensitivities were then determined.

| Example | Developer | Sensitivity | Remarks |
|---|---|---|---|
| C2 | A | 110 $mJcm^{-2}$ | Image attack seen as speckles |
| 7 | A | 80 $mJcm^{-2}$ | |
| 8 | A | 83 $mJcm^{-2}$ | |
| 9 | A | 80 $mJcm^{-2}$ | |
| 10 | A | 69 $mJcm^{-2}$ | |
| 11 | A | 92 $mJcm^{-2}$ | |
| 12 | A | 67 $mJcm^{-2}$ | |

Examples 13–14

The coating formulations for examples 13–14 were prepared as described in examples 1–6 as solutions in 2-methoxypropan-2-ol/dimethylformamide 50:50 (v:v). The formulations were coated as previously described to provide the specified dry film composition with a coating film weight of 2.5 $gm^{-2}$ after thorough drying at 130° C. for 3 minutes in a Mathis labdryer oven.

| | Example | |
|---|---|---|
| | 13 | 14 |
| Component | Parts by Weight | |
| Resin B | 82 | 82 |
| Prussian Blue | 12 | 12 |
| Onium Compound 1 | 6 | |
| Onium Compound 3 | | 6 |

The plates were then imaged on the Creo Trendsetter at 8 watts with a 0 to 100% screen image at an imaging energy density of 240 $mJcm^{-2}$. The exposed plates were then developed using a Horsell Mercury Mark V plate processor containing developer A at 22° C. The processing speed was set at 1000 mm $min^{-1}$. Finally, images produced were evaluated visually and were measured using a Tobias plate check densitometer as supplied by Tobias Associates Inc. of Ivyland, Pa., USA.

| | Densitomer Reading | Resolution Range at 240 $mJcm^{-2}$ |
|---|---|---|
| Example 13 | 50 | 1% to 99% |
| Example 14 | 38 | — |

This result indicates that for example 13 an imaging energy density of 240 $mJcm^{-2}$ was suitable. For example 14 a different imaging density would be more suitable.

Examples C4 and 15–18

The coating formulations for examples C4 and 15–18 were prepared as described in examples 1–6 as solutions in 2-methoxypropan-2-ol/dimethylformamide 50:50 (v:v). The formulations were coated as previously described to provide the specified dry film composition with a coating film weight of 2.5 $gm^{-2}$ after thorough drying at 130° C. for 3 minutes in a Mathis labdryer oven.

| | Example | | | | |
|---|---|---|---|---|---|
| | C4 | 15 | 16 | 17 | 18 |
| Component | Parts by Weight | | | | |
| Resin B | 88 | 85 | 82 | 55 | 82 |
| Prussian Blue | 12 | 12 | 12 | 12 | 12 |
| Onium Compound 5 | | 3 | 6 | | |
| Onium Compound 6 | | | | 3 | 6 |

The plates were then imaged on the rotatable disc apparatus as described above. The exposed plates were then processed by immersing in developer A at 20° C. for 60 seconds as described in the table below. Plate sensitivities were then determined.

| Example | Sensitivity | Remarks |
|---|---|---|
| C4 | 105 $mJcm^{-2}$ | |
| 15 | 76 $mJcm^{-2}$ | Image attack seen as speckles |
| 16 | 76 $mJcm^{-2}$ | |
| 17 | 76 $mJcm^{-2}$ | |
| 18 | 80 $mJcm^{-2}$ | |

Examples 19–20

The coating formulations for examples 19–20 were prepared as described in examples 1–6 as solutions in 2-methoxypropan-2-ol/dimethylformamide 50:50 (v:v). The formulations were coated as previously described to provide the specified dry film composition with a coating film weight of 2.5 $gm^{-2}$ after thorough drying at 130° C. for 3 minutes in a Mathis dryer oven.

| | Example | |
|---|---|---|
| | 19 | 20 |
| Component | Parts by Weight | |
| Resin B | 82 | 82 |
| Onium Compound 1 | 6 | 6 |
| FW2 | 12 | |
| Prussian Blue | | 12 |

The plates were then imaged on the rotatable disc apparatus as described above. The exposed plates were then processed by immersing in developer A at 20° C. for 60 seconds as described in the table below. Plate sensitivities were then determined.

| Example | Sensitivity |
|---|---|
| 19 | 97 $mJcm^{-2}$ |
| 20 | 95 $mJcm^{-2}$ |

Examples 21–26

The coating formulations for examples 21–26 were prepared as described in examples 1–6 as solutions in 2-methoxypropan-2-ol/dimethylformamide 90:10 (v:v). The formulations were coated as previously described to provide the specified dry film composition with a coating film weight of 2.5 $gm^{-2}$ after thorough drying at 130° C. for 3 minutes in a Mathis labdryer oven.

| | Example | | | | | |
|---|---|---|---|---|---|---|
| | 21 | 22 | 23 | 24 | 25 | 26 |
| Component | Parts by Weight | | | | | |
| Resin A | 86 | 85 | 84 | 83 | 82 | 81 |
| Prussian Blue | 12 | 12 | 12 | 12 | 12 | 12 |
| Onium Compound 1 | 2 | 3 | 4 | 5 | 6 | 7 |

The plates were then imaged on the Creo Trendsetter at 8 watts with a 0 to 100% screen image at an imaging energy density of 240 $mJcm^{-2}$. The exposed plates were then developed using a Horsell Mercury Mark V plate processor containing developer A at 22° C. The processing speed was set at 1000 mm $min^{-1}$. Finally, images produced were evaluated visually and were measured using a Tobias plate check densitometer.

| Example | Resolution Range at 240 $mJcm^{-2}$ |
|---|---|
| 21 | Coating washes away |
| 22 | 7% to 70% |
| 23 | 3% to 50% |
| 24 | 3% to 50% |
| 25 | 3% to 45% |
| 26 | No image produced |

Examples 27–36

The coating formulations for examples 27–36 were prepared as described in examples 1–6 as solutions in 2-methoxypropan-2-ol/dimethylformamide 90:10 (v:v). The formulations were coated as previously described to provide the specified dry film composition with a coating film weight of 2.5 $gm^{-2}$ after thorough drying at 130° C. for 3 minutes in a Mathis labdryer oven.

| | Example | | | | | | | |
|---|---|---|---|---|---|---|---|---|
| | 27 | 28 | 29 | 30 | 31 | 32 | 33 | 34 |
| Component | Parts by Weight | | | | | | | |
| Resin A | 78 | 78 | 80 | 80 | 80 | 80 | 80 | 80 |
| Dye W | 4 | 4 | | | | | | |
| Onium Compound 1 | 6 | 6 | 6 | 6 | 6 | 6 | 6 | 6 |
| Prussian Blue | 12 | | 12 | | 12 | | 12 | |
| FW2 | | 12 | | 12 | | 12 | | 12 |
| Dye X | | | 2 | 2 | | | | |
| Dye Y | | | | | 2 | 2 | | |
| Dye Z | | | | | | | 2 | 2 |

| | Example | |
|---|---|---|
| | 35 | 36 |
| Component | Parts by Weight | |
| Resin A | 82 | 82 |
| Onium Compound 1 | 6 | 6 |
| Prussian Blue | | 12 |
| FW2 | 12 | |

Dissolution Inhibition Tests

The plates of examples 27–36 above were tested for developability by immersing an in aqueous developer solution at 20° C. for an appropriate time as described below. The table below lists the results of the simple developability tests for the compositions. Corresponding plate samples were also tested by the direct heat imaging method described above. The treated plate samples were processed by immersion in the appropriate developer at 20° C. for an appropriate time. These results are also given in the table below.

| | Dissolution Inhibition Test | | Direct Heat Imaging | | |
|---|---|---|---|---|---|
| | Developer | Time to fully remove coating/seconds | Developer | Time/s | Direct heat imaging results |
| 27 | A | >60 | A | 60 | Coating totally removed only in area subjected to heat |
| 28 | A | 60 | A | 60 | All coating removed |
| 28 | B | >60 | B | 60 | Coating totally removed only in area subjected to heat |
| 29 | A | >60 | A | 60 | Coating totally removed only in area subjected to heat |
| 30 | A | 60 | A | 60 | All coating removed |
| 30 | B | >60 | B | 60 | Coating totally removed only in area subjected to heat |
| 31 | A | >60 | A | 60 | Coating totally removed only in area subjected to heat |
| 32 | A | 60 | A | 60 | All coating removed |
| 32 | B | >60 | B | 60 | Coating totally removed only in area subjected to heat |
| 33 | A | >60 | A | 60 | Coating totally removed only in area subjected to heat |
| 34 | A | 60 | A | 60 | All coating removed |
| 34 | B | >60 | B | 60 | Coating totally removed only in area subjected to heat |
| 35 | B | 30 | B | 20 | Coating totally removed only in area subjected to heat |
| 36 | A | >60 | A | 60 | Coating totally removed only in area subjected to heat |

In reviewing all of the examples 1–36 described above it should not be assumed that an example which does not show a good result denotes an unusable composition. The test conditions selected are likely to be suitable for some compositions and not for others; they are not optimized for each composition.

In the specification we refer in various places to UV, infra-red and visible radiation. A person skilled in the art will be aware of the typical wavelength ranges of these radiations, and that there may be an overlap at the margins between definitions of these terms, and also that many sources emit a distribution of wavelengths. However, UV radiation typically has a wavelength range not exceeding about 450 nm. Visible radiation has a wavelength range typically of about 400 to 700 nm. Infra-red radiation typically has a wavelength range in excess of 600 nm, the boundaries between ultraviolet and visible radiation, and between infrared radiation and visible radiation, not being sharp ones. When we state in this specification that radiation is, for example, "predominantly" infra-red radiation we mean that whilst there may be non-infra-red components in the wavelength distribution these are not significant, in the method.

Having described the invention, we now claim the invention and all of its equivalents.

What is claimed is:

1. A method for producing a predetermined resist pattern on a support, the method comprising:

(a) patternwise exposing a precursor to heat, the precursor comprising a coating on the support, and producing exposed regions in the coating; and (b) applying a developer to the coating and preferentially removing the exposed regions;

in which the coating consists essentially of:

(i) a novolac resin;

(ii) optionally, an additional resin component;

(iii) a latent Brönsted acid;

(iv) optionally, a pigment that absorbs radiation and converts it to heat; and (v) optionally, one or more components selected from the group consisting of stabilizing additives and inert colorants;

wherein said novolac resin is present in an amount of at least 85 wt % of the total resin content of said coating.

2. The method of claim 1 in which step (a) is carried out by direct delivery of heat patternwise by a heated body to the precursor.

3. The method of claim 2 wherein said latent Brönsted acid is an onium salt.

4. The method of claim 2 wherein the precursor is an article precursor and an imaged article is produced.

5. The method of claim 2 wherein the precursor is a printing form precursor and a printing form precursor is produced.

6. The method of claim 2 wherein the precursor is an electronic part precursor and an electronic part is produced.

7. The method of claim 2 wherein the precursor is a mask precursor and a mask is produced.

8. The method of claim 1 wherein said novolac resin is the sole resin component of said coating.

9. The method of claim 8 wherein said latent Brönsted acid is an onium salt selected from the group consisting of iodonium, sulphonium, oxysulphonium, phosphonium, bromonium, chloronium, sulphoxonium, selenonium, telluronium, diazonium and arsonium salts.

10. The method of claim 9 wherein said novolac resin is 90–100% by weight of the total resin content of the coating, said latent Bronsted acid is 1.5 to 15% by weight of the coating, and said pigment is 2 to 15% by weight of the coating.

11. A method for producing a predetermined resist pattern on a support, the method comprising:

(a) patternwise exposing a precursor to electromagnetic radiation, the precursor comprising a coating on the support, and producing exposed regions in the coating; and (b) applying a developer to the coating and preferentially removing the exposed regions;

in which the coating consists essentially of:

(i) a novolac resin, the novolac resin comprising at least 85% of the resin content of the coating;

(ii) optionally, an additional resin component;

(iii) a latent Brönsted acid;

(iv) optionally, a pigment that absorbs radiation and converts it to heat; and (v) optionally, one or more components selected from the group consisting of stabilizing additives and inert colorants.

12. The method of claim 11 wherein said electromagnetic radiation predominantly exceeds 500 nm.

13. The method of claim 11 wherein said electromagnetic radiation is predominantly 600 to 1400 nm.

14. The method of claim 11 wherein said electromagnetic radiation is delivered by a laser.

15. The method of claim 11 wherein said precursor comprises a pigment which absorbs radiation and converts it to heat.

16. The method of claim 15 wherein said precursor comprises an additional layer disposed between said coating and said support, and wherein said additional layer comprises said pigment.

17. The method of claim 15 wherein said pigment is selected from the group consisting of carbon black and ferric ferrocyanide.

18. The method of claim 11 wherein said novolac resin is the sole resin component of said coating.

19. The method of claim 18 wherein said latent Brönsted acid is an onium salt selected from the group consisting of iodonium, sulphonium, oxysulphonium, phosphonium, bromonium, chloronium, sulphoxonium, selenonium, telluronium, diazonium and arsonium salts.

20. The method of claim 19 wherein said novolac resin is 90–100% by weight of the total resin content of the coating, said latent Brönsted acid is 1.5 to 15% by weight of the coating, and said pigment is 2 to 15% by weight of the coating.

21. The method of claim 11 wherein said latent Brönsted acid is an onium salt.

22. The method of claim 11, wherein said precursor is an article precursor and an imaged article is produced.

23. The method of claim 11 wherein said precursor is a printing form precursor and a printing form precursor is produced.

24. The method of claim 11 wherein said precursor is an electronic part precursor and an electronic part is produced.

25. The method of claim 11 wherein said precursor is a mask precursor and a mask is produced.

* * * * *

UNITED STATES PATENT AND TRADEMARK OFFICE

CERTIFICATE OF CORRECTION

PATENT NO. : 6,352,814 B1
DATED : March 5, 2002
INVENTOR(S) : McCullough et al.

It is certified that error appears in the above-identified patent and that said Letters Patent is hereby corrected as shown below:

<u>Column 16,</u>
Line 47, delete the second occurrence of "precursor"

<u>Column 18,</u>
Line 23, delete the second occurrence of "precursor"

Signed and Sealed this

Fourteenth Day of May, 2002

*Attest:*

JAMES E. ROGAN

*Attesting Officer* *Director of the United States Patent and Trademark Office*